US012230714B2

(12) United States Patent
Das et al.

(10) Patent No.: US 12,230,714 B2
(45) Date of Patent: Feb. 18, 2025

(54) SELF-ALIGNED GATE ENDCAP (SAGE) ARCHITECTURES WITH VERTICAL SIDEWALLS

(71) Applicant: Intel Corporation, Santa Clara, CA (US)

(72) Inventors: Ritesh K. Das, Hillsboro, OR (US); Kiran Chikkadi, Hillsboro, OR (US); Ryan Pearce, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/622,615

(22) Filed: Mar. 29, 2024

(65) Prior Publication Data

US 2024/0243202 A1 Jul. 18, 2024

Related U.S. Application Data

(63) Continuation of application No. 16/868,828, filed on May 7, 2020.

(51) Int. Cl.
| | | |
|---|---|---|
| *H01L 29/78* | (2006.01) | |
| *H01L 29/49* | (2006.01) | |
| *H01L 21/02* | (2006.01) | |

(52) U.S. Cl.
CPC ...... *H01L 29/7855* (2013.01); *H01L 29/4983* (2013.01); *H01L 29/7848* (2013.01); *H01L 21/02532* (2013.01); *H01L 21/02576* (2013.01)

(58) Field of Classification Search
CPC ..... H01L 21/823431; H01L 21/823821; H01L 27/0886; H01L 29/0642; H01L 29/0649;
(Continued)

(56) References Cited

U.S. PATENT DOCUMENTS

| | | |
|---|---|---|
| 9,583,600 B1 | 2/2017 | Lin |
| 9,640,636 B1 | 5/2017 | Bentley et al. |
| | (Continued) | |

FOREIGN PATENT DOCUMENTS

| | | |
|---|---|---|
| TW | 201743383 A | 12/2017 |
| WO | 2016204755 A1 | 12/2016 |
| | (Continued) | |

OTHER PUBLICATIONS

European Patent Office, "Extended European Search Report," issued in connection with European Patent Application No. 19175746.7-1212, dated Oct. 30, 2019, 9 pages.

(Continued)

*Primary Examiner* — Eric A. Ward
(74) *Attorney, Agent, or Firm* — Hanley, Flight & Zimmerman, LLC

(57) ABSTRACT

Self-aligned gate endcap (SAGE) architectures with vertical sidewalls, and methods of fabricating self-aligned gate endcap (SAGE) architectures with vertical sidewalls, are described. In an example, an integrated circuit structure includes a semiconductor fin having sidewalls along a length of the semiconductor fin, each sidewall tapering outwardly from a top of the semiconductor fin toward a bottom of the semiconductor fin. A gate endcap isolation structure is spaced apart from the semiconductor fin and has a length parallel with the length of the semiconductor fin. The gate endcap isolation structure has a substantially vertical sidewall laterally facing one of the outwardly tapering sidewalls of the semiconductor fin.

28 Claims, 13 Drawing Sheets

(58) Field of Classification Search
CPC ........... H01L 29/0653; H01L 29/66545; H01L 29/66795–66818; H01L 29/785–7856; H01L 2029/7857; H01L 2029/7858
See application file for complete search history.

(56) References Cited

U.S. PATENT DOCUMENTS

| | | | |
|---|---|---|---|
| 10,276,676 | B1 | 4/2019 | Liang et al. |
| 10,325,912 | B2 | 6/2019 | Chen et al. |
| 11,233,152 | B2 | 1/2022 | Guha et al. |
| 11,855,223 | B2 | 12/2023 | Guha et al. |
| 2014/0084342 | A1 | 3/2014 | Cappellani et al. |
| 2014/0091360 | A1 | 4/2014 | Pillarisetty et al. |
| 2014/0209855 | A1 | 7/2014 | Cea et al. |
| 2015/0041899 | A1 | 2/2015 | Yang et al. |
| 2015/0054078 | A1 | 2/2015 | Xie et al. |
| 2015/0325646 | A1 | 11/2015 | Lai et al. |
| 2016/0172445 | A1 | 6/2016 | Kim et al. |
| 2016/0233298 | A1* | 8/2016 | Webb ............. H01L 21/823821 |
| 2017/0148681 | A1 | 5/2017 | Basker et al. |
| 2017/0278845 | A1 | 9/2017 | Tung |
| 2017/0330801 | A1 | 11/2017 | Ragnarsson et al. |
| 2017/0330972 | A1 | 11/2017 | Kloster et al. |
| 2018/0204932 | A1 | 7/2018 | Mehandru et al. |
| 2018/0233572 | A1 | 8/2018 | Cheng et al. |
| 2019/0067301 | A1 | 2/2019 | Yang et al. |
| 2019/0067417 | A1* | 2/2019 | Ching ............. H01L 21/823878 |
| 2019/0148539 | A1 | 5/2019 | Yang et al. |
| 2019/0189804 | A1 | 6/2019 | You et al. |
| 2019/0214473 | A1 | 7/2019 | Xie et al. |
| 2019/0287972 | A1 | 9/2019 | Hafez et al. |
| 2019/0386002 | A1 | 12/2019 | Wu et al. |
| 2020/0006075 | A1 | 1/2020 | Wang et al. |
| 2020/0083222 | A1* | 3/2020 | Kim ................ H01L 21/823821 |
| 2020/0105581 | A1 | 4/2020 | Chang et al. |
| 2020/0105604 | A1 | 4/2020 | Lin et al. |
| 2021/0050225 | A1 | 2/2021 | Long |
| 2021/0119033 | A1 | 4/2021 | Chien et al. |
| 2021/0249309 | A1 | 8/2021 | Wu et al. |
| 2021/0343597 | A1 | 11/2021 | Ko et al. |
| 2024/0243202 | A1 | 7/2024 | Das |

FOREIGN PATENT DOCUMENTS

| | | | |
|---|---|---|---|
| WO | 2018063259 | A1 | 4/2018 |
| WO | 2018063365 | A1 | 4/2018 |

OTHER PUBLICATIONS

European Patent Office, "Communication pursuant to Article 94(3) EPC," issued in connection with European Patent Application No. 19175746.7-1212, dated Jul. 19, 2021, 8 pages.
United States Patent and Trademark Office, "Notice of Allowance and Fee(s) Due," issued in connection with U.S. Appl. No. 16/017,966, dated Sep. 22, 2021, 8 pages.
United States Patent and Trademark Office, "Corrected Notice of Allowability," issued in connection with U.S. Appl. No. 16/017,966, dated Oct. 26, 2021, 6 pages.
United States Patent and Trademark Office, "Supplemental Notice of Allowability," issued in connection with U.S. Appl. No. 16/017,966, dated Dec. 1, 2021, 2 pages.
United States Patent and Trademark Office, "Non-Final Office Action," issued in connection with U.S. Appl. No. 16/868,828 dated Jan. 6, 2022, 18 pages.
United States Patent and Trademark Office, "Final Office Action," issued in connection with U.S. Appl. No. 16/868,828 dated Aug. 22, 2024, 14 pages.
United States Patent and Trademark Office, "Final Office Action," issued in connection with U.S. Appl. No. 16/868,828 dated Jul. 8, 2022, 23 pages.
Taiwan Intellectual Property Office, "Notice of Preliminary Review Opinion and Search Report," issued in connection with Taiwan Patent Application No. 108116744, Sep. 7, 2022, 24 pages (English translation included).
United States Patent and Trademark Office, "Advisory Action," issued in connection with U.S. Appl. No. 16/868,828 dated Sep. 14, 2022, 3 pages.
United States Patent and Trademark Office, "Non-Final Office Action," issued in connection with U.S. Appl. No. 16/868,828 dated Oct. 25, 2022, 23 pages.
United States Patent and Trademark Office, "Non-Final Office Action," issued in connection with U.S. Appl. No. 17/549,827, dated Dec. 29, 2022, 11 pages.
United States Patent and Trademark Office, "Final Office Action," issued in connection with U.S. Appl. No. 17/549,827, dated Apr. 20, 2023, 17 pages.
Taiwan Intellectual Property Office, "Notice of Allowance," issued in connection with Taiwan Patent Application No. 108116744, Apr. 24, 2023, 3 pages (English translation included).
United States Patent and Trademark Office, "Final Office Action," issued in connection with U.S. Appl. No. 16/868,828 dated May 24, 2023, 27 pages.
United States Patent and Trademark Office, "Advisory Action," issued in connection with U.S. Appl. No. 17/549,827, dated Jun. 23, 2023, 3 pages.
United States Patent and Trademark Office, "Advisory Action," issued in connection with U.S. Appl. No. 16/868,828 dated Jul. 31, 2023, 3 pages.
Taiwan Intellectual Property Office, "Certificate of Patent," issued in connection with Taiwan Patent Application No. 108116744, Aug. 11, 2023, 2 pages.
United States Patent and Trademark Office, "Notice of Allowance and Fee(s) Due," issued in connection with U.S. Appl. No. 17/549,827, dated Aug. 28, 2023, 8 pages.
United States Patent and Trademark Office, "Non-Final Office Action," issued in connection with U.S. Appl. No. 16/868,828 dated Sep. 8, 2023, 29 pages.
United States Patent and Trademark Office, "Final Office Action," issued in connection with U.S. Appl. No. 16/868,828 dated Jan. 12, 2024, 22 pages.
European Patent Office, "Extended European Search Report," issued in connection with European Patent Application No. 23214499.8-1212, dated Mar. 6, 2024, 12 pages.
United States Patent and Trademark Office, "Advisory Action," issued in connection with U.S. Appl. No. 16/868,828 dated Mar. 15, 2024, 3 pages.
United States Patent and Trademark Office, "Non-Final Office Action," issued in connection with U.S. Appl. No. 16/868,828, dated May 3, 2024, 17 pages.
United States Patent and Trademark Office, "Non-Final Office Action," issued in connection with U.S. Appl. No. 18/374,959, dated Jul. 18, 2024, 8 pages.
United States Patent and Trademark Office, "Notice of Allowance and Fee(s) Due," issued in connection with U.S. Appl. No. 16/868,828, dated Oct. 16, 2024, 9 pages.
United States Patent and Trademark Office, "Notice of Allowance and Fee(s) Due," issued in connection with U.S. Appl. No. 18/374,959, dated Oct. 21, 2024, 8 pages.
United States Patent and Trademark Office, "Non-Final Office Action," issued in connection with U.S. Appl. No. 18/622,659, dated Dec. 26, 2024, 11 pages.

* cited by examiner

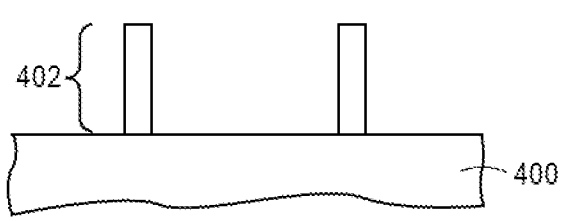 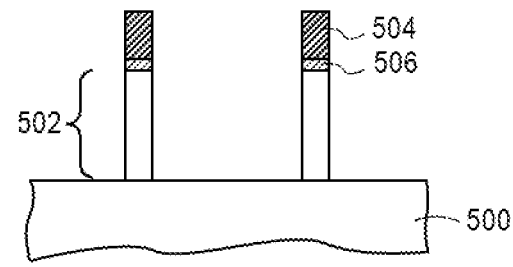
FIG. 4A  FIG. 5A
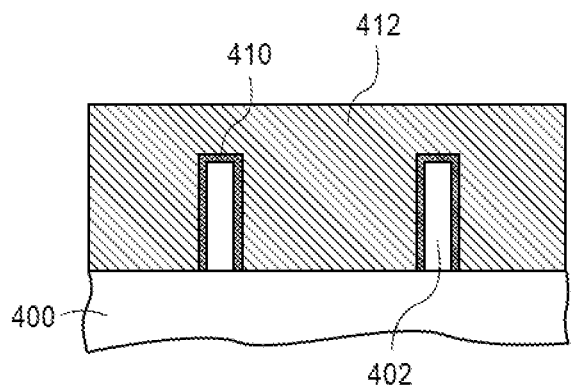 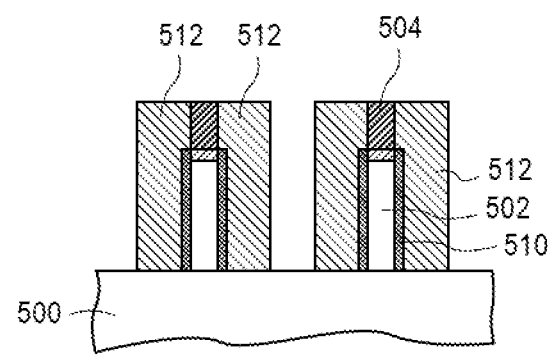
FIG. 4B  FIG. 5B

SELF-ALIGNED GATE ENDCAP (SAGE) ARCHITECTURES WITH VERTICAL SIDEWALLS

RELATED APPLICATION(S)

This patent arises from a continuation of U.S. patent application Ser. No. 16/868,828, which was filed on May 7, 2020. U.S. patent application Ser. No. 16/868,828 is incorporated herein by reference in its entirety. Priority to U.S. patent application Ser. No. 16/868,828 is claimed.

TECHNICAL FIELD

Embodiments of the disclosure are in the field of semiconductor devices and processing and, in particular, self-aligned gate endcap (SAGE) architectures with vertical sidewalls, and methods of fabricating self-aligned gate endcap (SAGE) architectures with vertical sidewalls.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming In particular, there may be a trade-off between the smallest dimension of a feature patterned in a semiconductor stack (the critical dimension) and the spacing between such features.

BRIEF DESCRIPTION OF THE DRAWINGS

FIGS. 4A-4D illustrate cross-sectional views of process operations of significance in a conventional finFET or tri-gate process fabrication scheme.

FIGS. 5A-5D illustrate cross-sectional views of process operations of significance in a self-aligned gate endcap process fabrication scheme for finFET or tri-gate devices, in accordance with an embodiment of the present disclosure.

DESCRIPTION OF THE EMBODIMENTS

Figure 1:
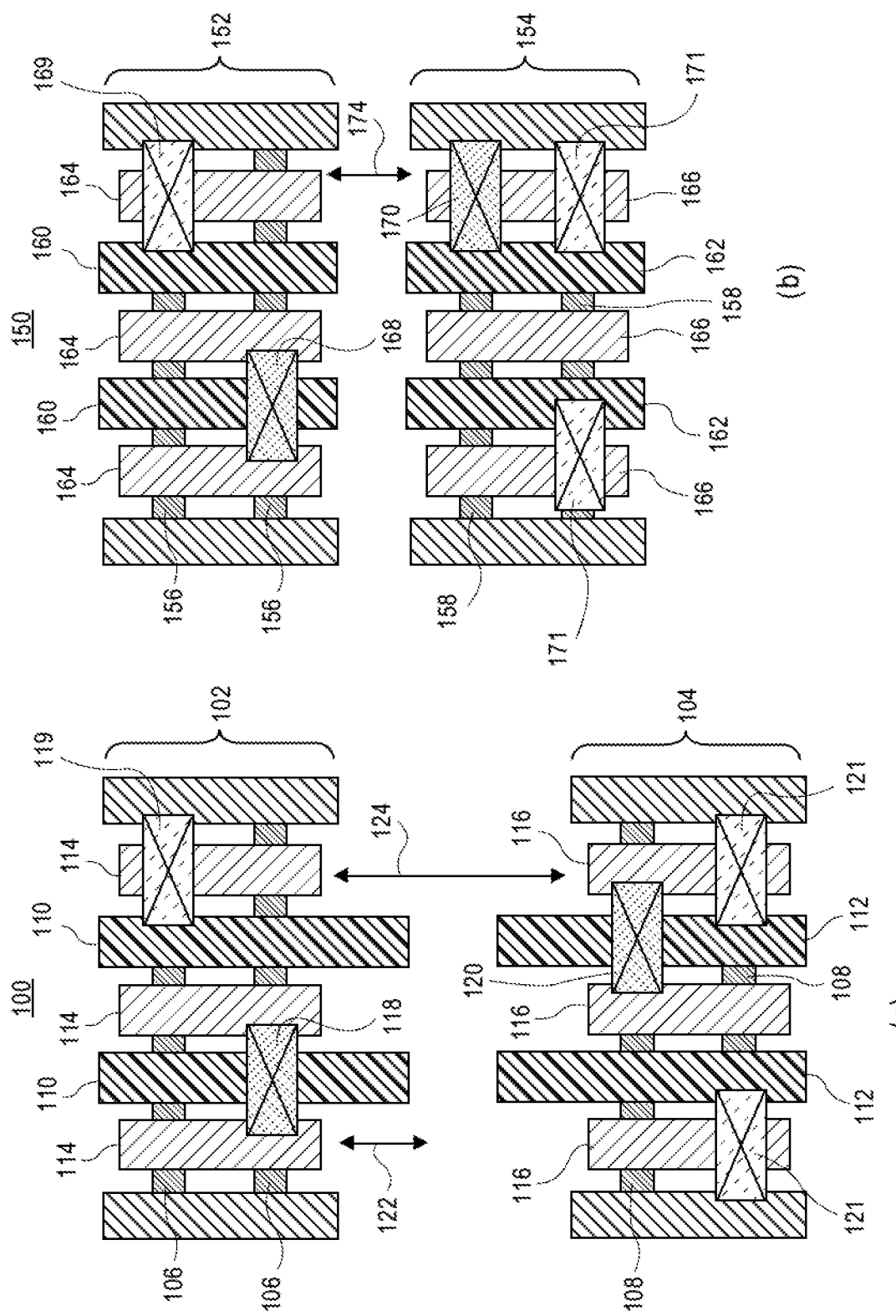
FIG. 1 illustrates plan views of adjacent integrated circuit structures for a conventional architecture with relatively wide spacing (left-hand side (a)) versus adjacent integrated circuit structures for a self-aligned gate endcap (SAGE) architecture with relatively tight spacing (right-hand side (b)), in accordance with an embodiment of the present disclosure.

Self-aligned gate endcap (SAGE) architectures with vertical sidewalls, and methods of fabricating self-aligned gate endcap (SAGE) architectures with vertical sidewalls, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to semiconductor structures or devices having one or more gate endcap structures. Additionally, methods of fabricating gate endcap isolation structures in a self-aligned manner are also described. In one or more embodiments, sidewall slope engineering of a thermally grown oxide spacer is used to provide a tunable self-aligned wall profile. Embodiments described herein may address issues associated with scaling diffusion end-to-end spacing in an ultrascaled process technology.

To provide context, there may be issues associated with a given self-aligned wall (SAW) profile. For example, a SAW can act as a plug for a metal layer. In the case that a SAW is wider at the top due to incoming line/fin profiles that are narrower at a top than at a bottom, the resulting "top heavy" SAW can create shadowing for etch processes and result in undesired metal remnants. Such remaining metal can create a shorting path over the SAW or along the SAW line and defeat the purpose of the plug. More particularly, a top heavy SAW can create challenges for removing materials under a SAW overhang through etch shadowing.

State-of-the-art SAW fabrication can involve the use of a non-conformal, chemical vapor deposition (CVD) or CVD-like deposition providing a structure that is thicker at the top compared to the bottom because non-conformal deposition can depend on the pitch and profile of incoming structures. Embodiments described herein involve the implementations of non-conformal deposition approaches that do not depend on incoming profiles to the extent that a conformal deposition process depends on incoming profiles. Embodiments described herein may be implemented to yield a same trench profile for both narrow and wide pitch structures. Since approaches described herein may be less sensitive to incoming pitch than a conformal approach, wafer to wafer and within wafer uniformity may be improved as compared to a conformal approach.

To provide broader context, state-of-the-art approaches have relied on lithographic scaling of the gate end-to-end (poly cut) to define a minimum technology gate overlap of diffusion. The minimum technology gate overlap of diffusion is a key component in diffusion end-to-end space. An associated gate line (poly cut) process has typically been limited by lithography, registration, and etch bias considerations, and ultimately sets the minimum diffusion end-to-end distance. Other approaches such as contact over active gate (COAG) architectures have worked to improve such diffusion spacing capability. However, improvements in this technology arena remain highly sought after.

To provide a foundation to highlight advantages of embodiments of the present disclosure, it is first to be appreciated that advantages of a self-aligned gate endcap (SAGE) architecture over non-SAGE approaches may include the enabling of higher layout density and, in particular, scaling of diffusion to diffusion spacing. As an example, FIG. 1 illustrates plan views of adjacent integrated circuit structures for a conventional architecture with relatively wide spacing (left-hand side (a)) versus adjacent integrated circuit structures for a SAGE architecture with relatively tight spacing (right-hand side (b)), in accordance with an embodiment of the present disclosure.

Referring to the left-hand side (a) of FIG. 1, a layout 100 includes first 102 and second 104 integrated circuit structures based on semiconductor fins 106 and 108, respectively. Each device 102 and 104 has a gate electrode 110 or 112, respectively. Additionally, each device 102 and 104 has trench contacts (TCNs) 114 or 116, respectively, at source and drain regions of the fins 106 and 108, respectively. Gate vias 118 and 120, and trench contact vias 119 and 121 are also depicted.

Referring again to the left-hand side (a) of FIG. 1, the gate electrodes 110 and 112 have a relatively wide end cap region 122, which is located off of the corresponding fins 106 and 108, respectively. The TCNs 114 and 116 each have a relatively large end-to-end spacing 124, which is also located off of the corresponding fins 106 and 108, respectively.

By contrast, referring to the right-hand side (b) of FIG. 1, a layout 150 includes first 152 and second 154 integrated circuit structures based on semiconductor fins 156 and 158, respectively. Each device 152 and 154 has a gate electrode 160 or 162, respectively. Additionally, each device 152 and 154 has trench contacts (TCNs) 164 or 166, respectively, at source and drain regions of the fins 156 and 158, respectively. Gate vias 168 and 170, and trench contact vias 169 and 171 are also depicted.

Referring again to the right-hand side (b) of FIG. 1, the gate electrodes 160 and 162 have a relatively tight end cap region, which is located off of the corresponding fins 156 and 158, respectively. The TCNs 164 and 166 each have a relatively tight end-to-end spacing 174, which is also located off of the corresponding fins 156 and 158, respectively.

To provide further context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 2 illustrates a plan view of a conventional layout including fin-based semiconductor devices accommodating end-to-end spacing.

Figure 2:
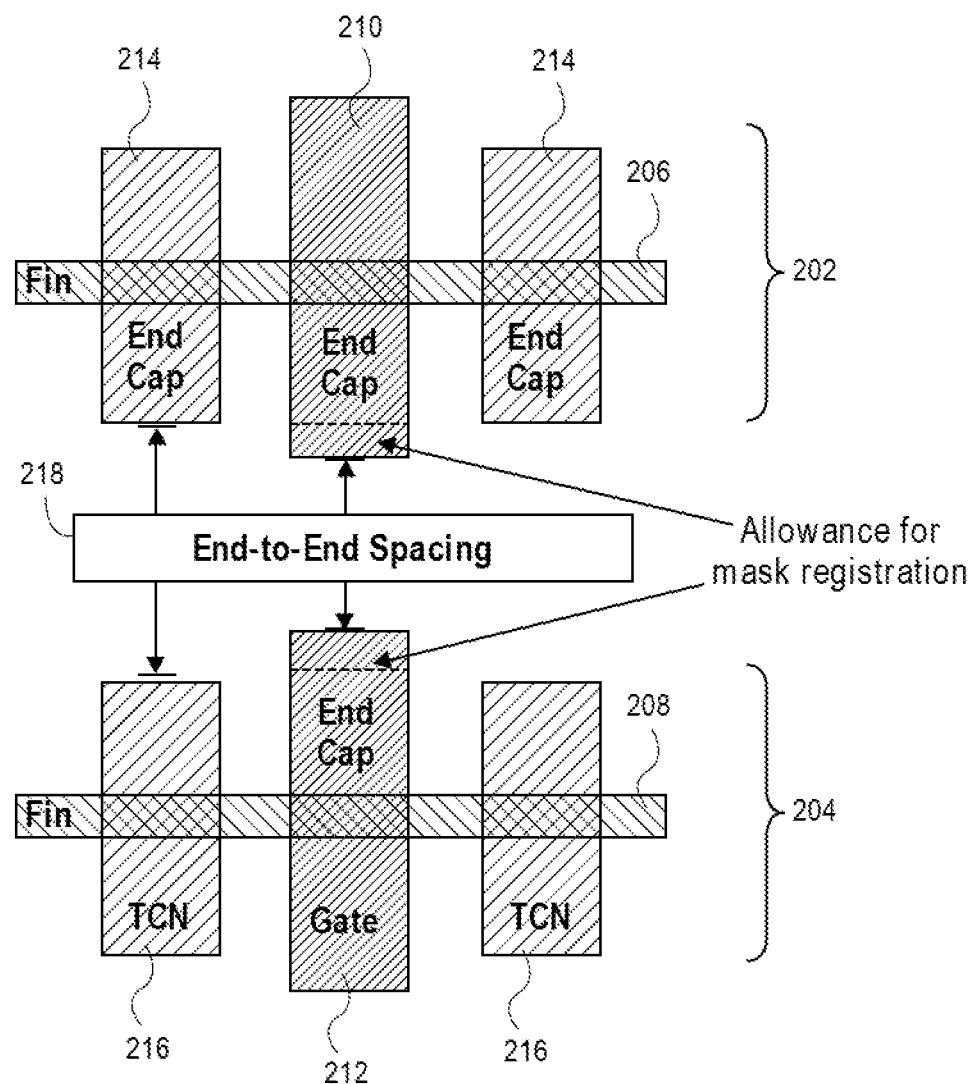
FIG. 2 illustrates a plan view of a conventional layout including fin-based semiconductor devices accommodating end-to-end spacing.

Referring to FIG. 2, first 202 and second 204 semiconductor devices are based on semiconductor fins 206 and 208, respectively. Each device 202 and 204 has a gate electrode 210 or 212, respectively. Additionally, each device 202 and 204 has trench contacts (TCNs) 214 or 216, respectively, at source and drain regions of the fins 206 and 208, respectively. The gate electrodes 210 and 212 and the TCNs 214 and 216 each have an end cap region, which is located off of the corresponding fins 206 and 208, respectively.

Referring again to FIG. 2, typically, gate and TCN endcap dimensions must include an allowance for mask registration error to ensure robust transistor operation for worst case mask mis-registration, leaving an end-to-end spacing 218. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin sidewalls which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 3 illustrates cross-sectional views taken through fins for a conventional architecture (left-hand side (a)) versus a self-aligned gate endcap (SAGE) architecture (right-hand side (b)), in accordance with an embodiment of the present disclosure.

Figure 3:
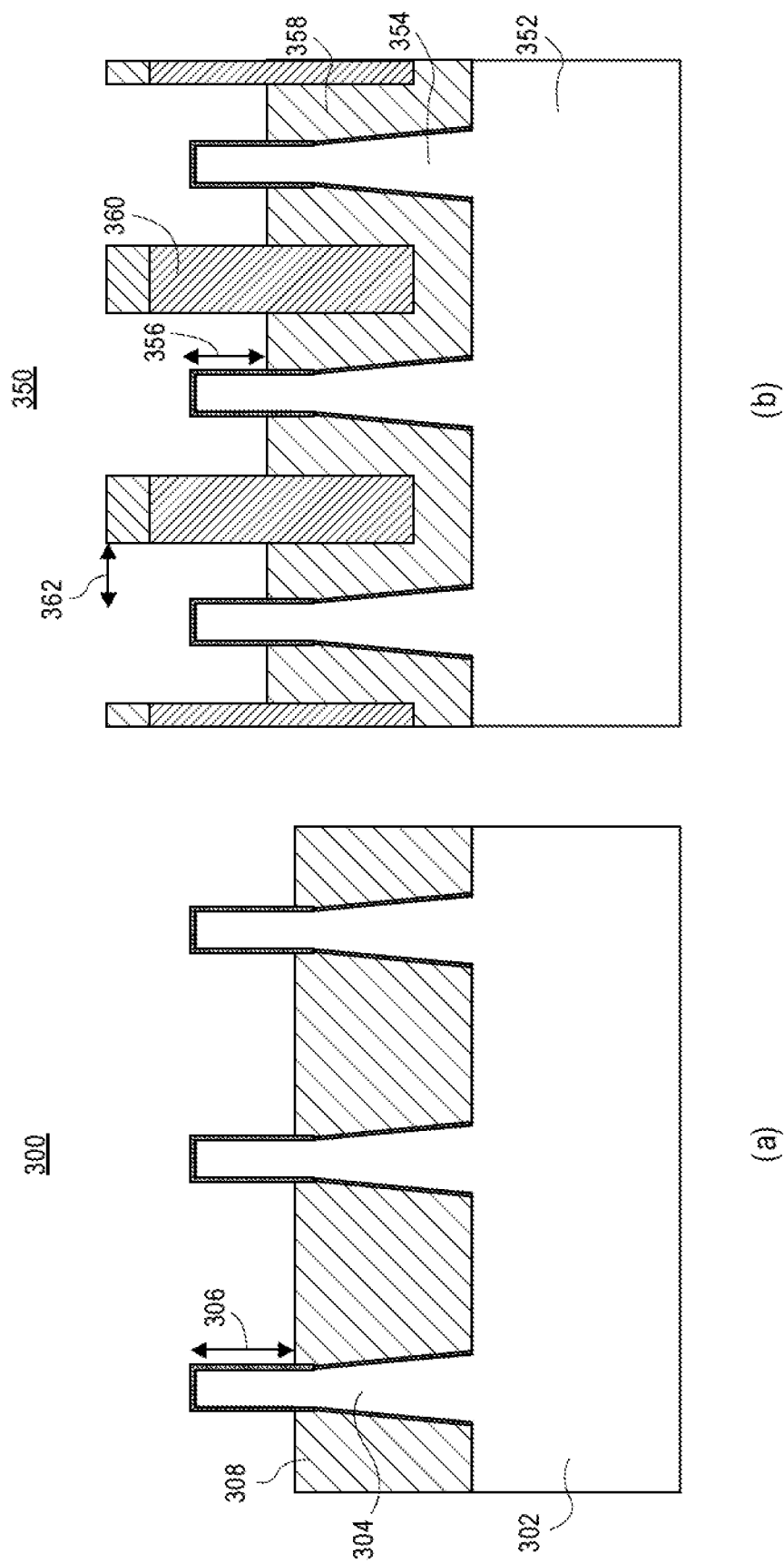
FIG. 3 illustrates cross-sectional views taken through fins for a conventional architecture (left-hand side (a)) versus a self-aligned gate endcap (SAGE) architecture (right-hand side (b)), in accordance with an embodiment of the present disclosure.

Referring to the left-hand side (a) of FIG. 3, an integrated circuit structure 300 includes a substrate 302 having fins 304 protruding therefrom. A height ($H_{Si}$) 306 of an active portion of the fins 304 is set by an isolation structure 308 laterally surrounding lower portions of the fins 304. A gate structure may be formed over the integrated circuit structure 300 to fabricate a device. However, breaks in such a gate structure are accommodated for by increasing the spacing between fins 304.

By contrast, referring to the right-hand side (b) of FIG. 3, an integrated circuit structure 350 includes a substrate 352 having fins 354 protruding therefrom. A height ($H_{Si}$) 356 of an active portion of the fins 354 is set by an isolation structure 358 laterally surrounding lower portions of the fins 354. Isolating SAGE walls 360 (which may include a hardmask thereon, as depicted) are included within the isolation structure 358 and between adjacent fins 354. The distance between an isolating SAGE wall 360 and a nearest fin 354 defines the gate endcap spacing 362. A gate structure may be formed over the integrated circuit structure 350, between insolating SAGE walls to fabricate a device. Breaks in such a gate structure are imposed by the isolating SAGE walls. Since the isolating SAGE walls 360 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 360.

In order to provide a side-by-side comparison, FIGS. 4A-4D illustrate cross-sectional views of process operations of significance in a conventional finFET or tri-gate process fabrication scheme, while FIGS. 5A-5D illustrate cross-sectional views of process operations of significance in a self-aligned gate endcap process fabrication scheme for finFET or tri-gate devices, in accordance with an embodiment of the present disclosure.

Referring to FIGS. 4A and 5A, a bulk semiconductor substrate 400 or 500, such as a bulk single crystalline silicon substrate is provided having fins 402 or 502, respectively, etched therein. In an embodiment, the fins are formed directly in the bulk substrate 400 or 500 and, as such, are formed continuous with the bulk substrate 400 or 500. It is to be appreciated that within the substrate 400 or 500, shallow trench isolation structures may be formed between fins. Referring to FIG. 5A, a hardmask layer 504, such as a silicon nitride hardmask layer, and a pad oxide layer 506, such as a silicon dioxide layer, remain atop fins 502 following patterning to form the fins 502. By contrast, referring to FIG. 4A, such a hardmask layer and pad oxide layer have been removed.

Referring to FIG. 4B, a dummy or permanent gate dielectric layer 410 is formed on the exposed surfaces of the semiconductor fins 402, and a dummy gate layer 412 is formed over the resulting structure. By contrast, referring to FIG. 5B, a dummy or permanent gate dielectric layer 510 is formed on the exposed surfaces of the semiconductor fins 502, and dummy spacers 512 are formed adjacent to the resulting structure.

Figure 4C:
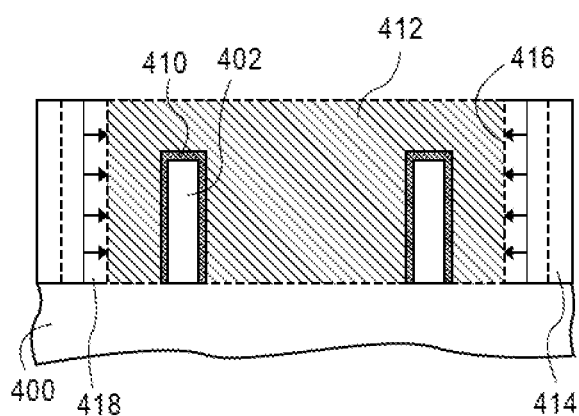

Referring to FIG. 4C, gate endcap cut patterning is performed and isolation regions 414 are formed at the resulting patterned dummy gate ends 416. In the conventional process scheme, a larger gate endcap must be fabricated to allow for gate mask mis-registration, as depicted by the arrowed regions 418. By contrast, referring to FIG. 5C, self-aligned isolation regions 514 are formed by providing an isolation layer over the structure of FIG. 5B, e.g., by deposition and planarization. In one such embodiment, the self-aligned gate endcap process does not require extra space for mask registration, as compared in FIGS. 4C and 5C.

Figure 4D:
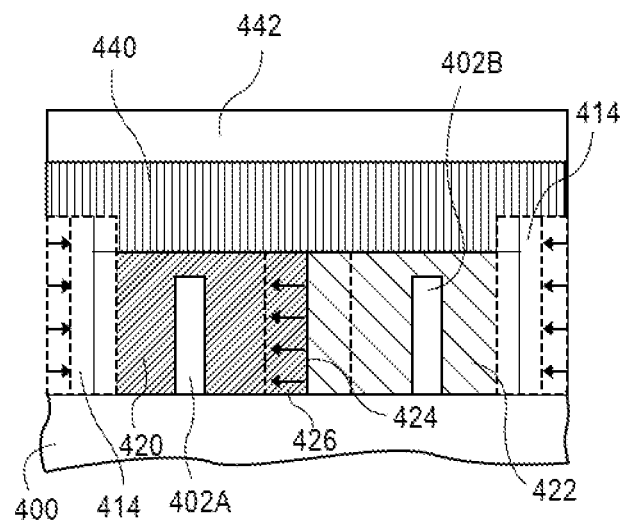

Referring to FIG. 4D, the dummy gate electrode 412 of FIG. 4C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 420 over a first semiconductor fin 402A and to provide a P-type gate electrode 422 over a second semiconductor fin 402B. The N-type gate electrode 420 and the P-type gate electrode 422 are formed between the isolation regions 414, but form a P/N junction 424 where they meet. The exact location of the P/N junction 424 may vary, depending on mis-registration, as depicted by the arrowed region 426.

Figure 5C:
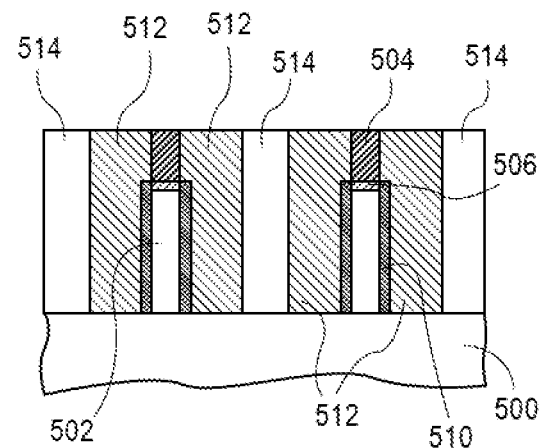
Figure 5D:
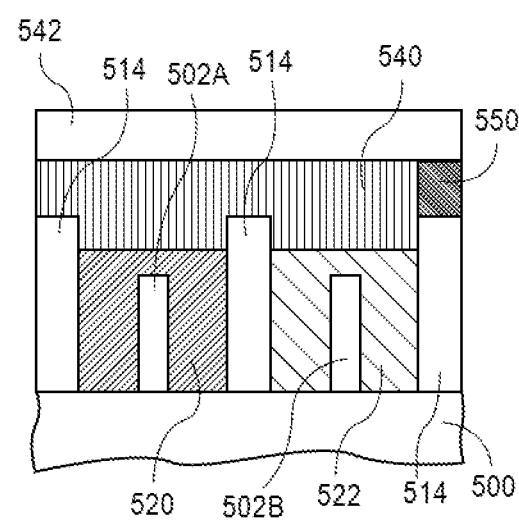

By contrast, referring to FIG. 5D, the hardmask layer 504 and pad oxide layer 506 are removed, and the dummy spacers 514 of FIG. 5C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 520 over a first semiconductor fin 502A and to provide a P-type gate electrode 522 over a second semiconductor fin 502B. The N-type gate electrode 520 and the P-type gate electrode 522 are formed between, and are also separated by, the gate endcap isolations structures 514.

Referring again to FIG. 4D, a local interconnect 440 may be fabricated to contact N-type gate electrode 420 and P-type gate electrode 422 to provide a conductive path around the P/N junction 424. Likewise, referring to FIG. 5D, a local interconnect 540 may be fabricated to contact N-type gate electrode 520 and P-type gate electrode 522 to provide a conductive path over the intervening isolation structure 514 there between. Referring to both FIGS. 4D and 5D, a hardmask 442 or 542 may be formed on the local interconnect 440 or 540, respectively. Referring to FIG. 5D in particular, in an embodiment, the continuity of the local interconnect 540 is interrupted by a dielectric plug 550 in cases where a break in electrical contact along a gate line are needed.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Embodiments of the present disclosure may be implemented to improve upon a SAGE wall formation method and location. Embodiments described herein may address difficulties in forming bi-directional SAGE walls resulting from the introduction of fin cuts. To provide context, a SAGE architecture may be implemented by fabricating a SAGE isolation structure after a process of cutting the fins to remove fin portions in select locations. It is to be appreciated that logic devices may be aggressively scaled in dimension, creating fabrication and yield challenges for gate and contact end cap patterning. A state-of-the-art self-aligned gate endcap (SAGE) architecture provides a potential landing spot for a gate or contact plug. The SAGE wall formation is self-aligned in the x-direction but only partly aligned in the y-direction since the SAGE architecture may be susceptible to contact to gate shorts at the fin end caps due to registration constraints at various lithographic patterning layers.

Figure 5E:
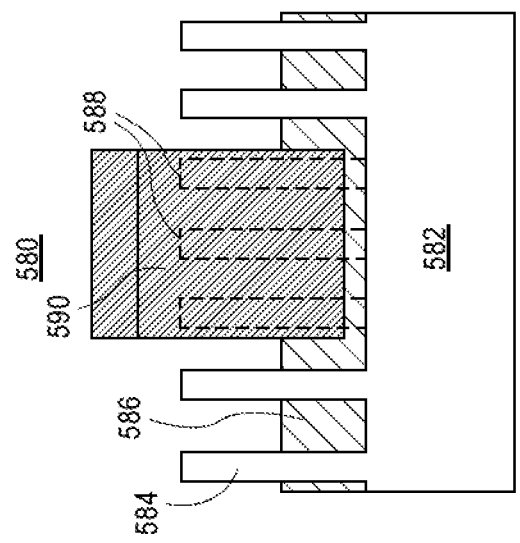
FIG. 5E illustrates cross-sectional views and corresponding plan views of integrated circuit structures fabricated (a) without a SAGE isolation structure, and (b) with a SAGE isolation structure fabricated only after a fin cut process, in accordance with an embodiment of the present disclosure.
Figure 5E:
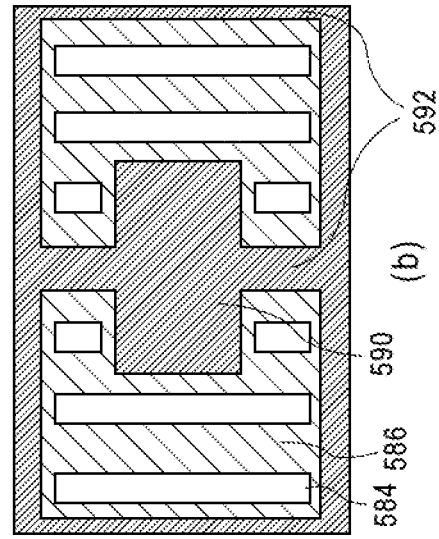
Figure 5E:
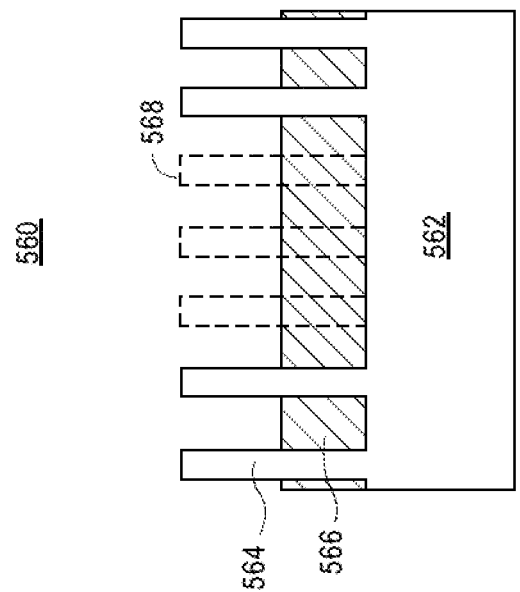
Figure 5E:
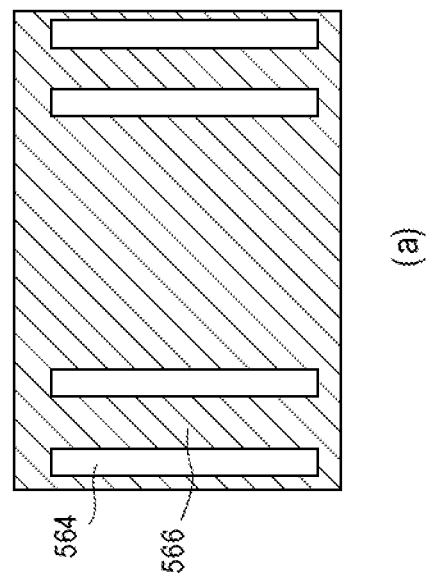

For comparative purposes, FIG. 5E illustrates cross-sectional views and corresponding plan views of integrated circuit structures fabricated (a) without a SAGE isolation structure, and (b) with a SAGE isolation structure fabricated only after a fin cut process, in accordance with an embodiment of the present disclosure.

Referring to part (a) of FIG. 5E, an integrated circuit structure 560 fabricated without a SAGE isolation structure includes a substrate 562 having a plurality of fins 564 protruding therefrom. An isolation structure 566 laterally surrounds lower portions of the fins 564. Locations 568 indicate regions where fins or portions of fins have been removed, e.g., by a masking and etch process. A process sequence for fabricating integrated circuit structure 560 may include (i) providing a silicon substrate, (ii) hardmask formation and patterning on the silicon substrate, (iii) silicon fin patterning by etching the silicon substrate in the presence of the hardmask, (iv) fin cutting by further mask and etch processing, and (v) shallow trench isolation (STI) fill, polish and recess to form isolation structure 566.

Referring to part (b) of FIG. 5E, an integrated circuit structure 580 fabricated by forming a SAGE isolation structure only after a fin cut process, which is referred to herein as a bi-directional SAGE architecture, includes a substrate 582 having a plurality of fins 584 protruding therefrom. An isolation structure 586 laterally surrounds lower portions of the fins 584. Locations 588 indicate regions where fins or portions of fins are removed, e.g., by a masking and etch process. A SAGE wall 590 (which may include a hardmask as indicated by the horizontal line) is formed in locations 588 and has extension portions 592 extending from the SAGE wall 590. A process sequence for fabricating integrated circuit structure 580 may include (i) providing a silicon substrate, (ii) SAGE stack formation, (iii) silicon fin patterning, (iv) fin cutting by further mask and etch processing, (v) SAGE endcap/wall fabrication, and (vi) shallow trench isolation (STI) fill, polish and recess to form isolation structure 586.

In another aspect, it is possible to use dielectric isolation walls to constrain device cell size and enable self-alignment of various features. Such isolation walls may either be taller than the semiconductor fins used to build devices or they may be the same height. The formation of isolation wall structures can involve covering the semiconducting fins with a CVD or ALD dielectric spacer. Due to the conformality of the spacer, resulting isolation walls may not have vertical profiles. Subsequent patterning of a gate line orthogonal to the direction of the semiconductor fins can lead to metal remnants or stringers along isolation walls that do not have vertical profiles. Such artifacts can lead to decreased device yield. In accordance with one or more embodiments described herein, a method to avoid the formation of metal remnants or stringers along isolation walls is described.

As a comparative processing scheme, FIGS. 6A-6F illustrate cross-sectional views representing various operations in a process for fabricating self-aligned gate endcap (SAGE) structures with sloped sidewalls.

Figure 6A:
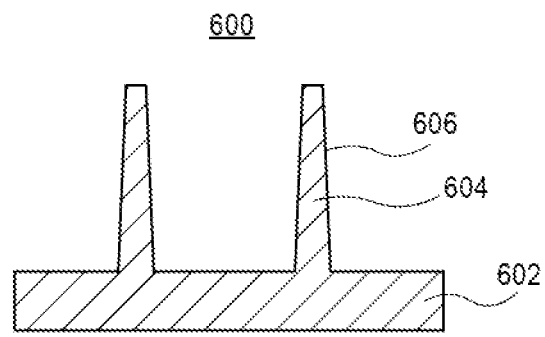
FIGS. 6A-6F illustrate cross-sectional views representing various operations in a process for fabricating self-aligned gate endcap (SAGE) structures with sloped sidewalls.
Figure 6B:
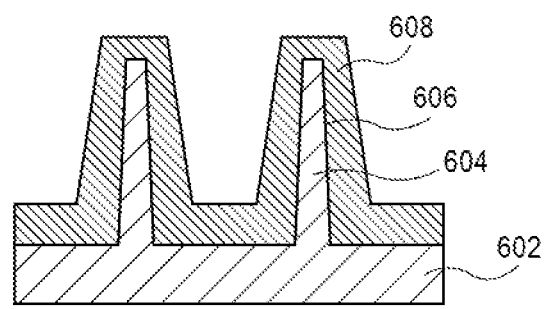
Figure 6C:
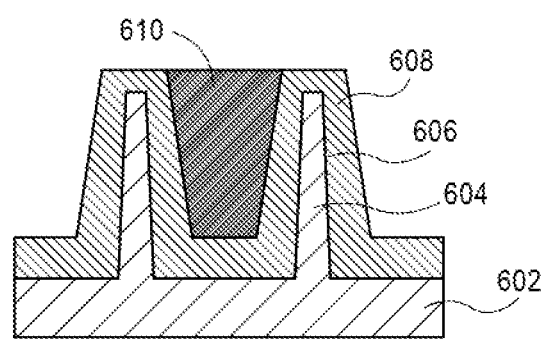
Figure 6D:
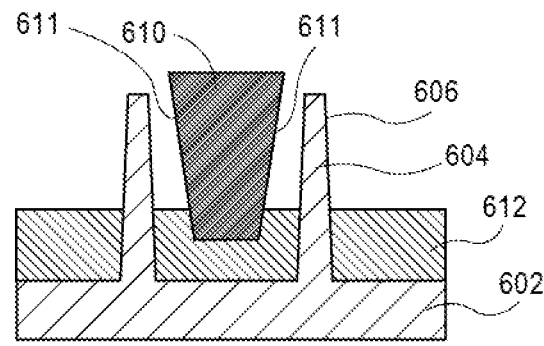
Figure 6E:
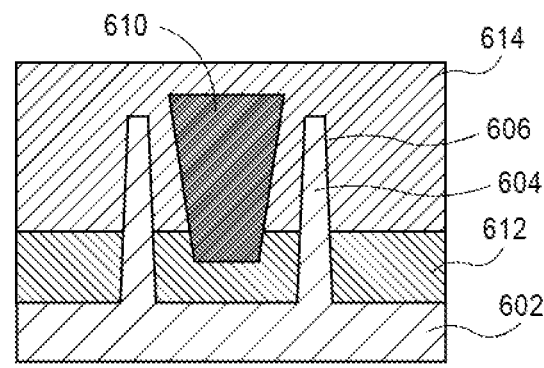
Figure 6F:
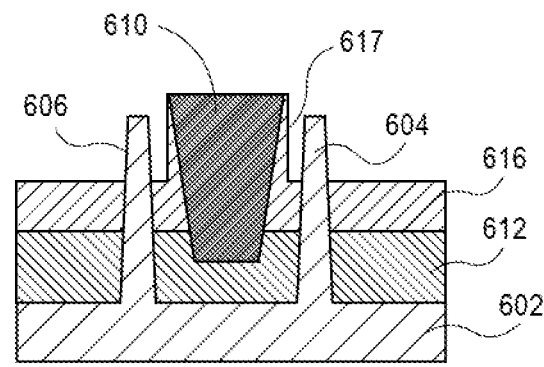

Referring to FIG. 6A, a starting structure 600 includes fins 604 that are fabricated as protruding from a substrate 602. Each fin 604 has outwardly tapering (top to bottom) sidewalls 606. A dielectric spacer-forming material 608 is formed conformal with the outwardly tapering sidewalls 606 of the fins 604, as is depicted in FIG. 6B. Referring to FIG. 6C, a dielectric plug material 610 (e.g., a SAGE wall or SAW material) is formed and retained on the dielectric spacer-forming material 608. The dielectric plug material 610 has inwardly tapering (top to bottom) sidewalls because the sidewalls are conformal with the outwardly tapering sidewalls of the dielectric spacer-forming material 608. Accordingly, since the fins 604 have outwardly tapering sidewalls 606, the dielectric plug material 610 has inwardly tapering sidewalls 611. The dielectric spacer-forming material 608 is recessed to provide a trench isolation structure 612. The dielectric plug material 610 is seated in the trench isolation structure 612, as is depicted in FIG. 6D. Referring to FIG. 6E, a metal layer or metal-containing layer 614 is formed over the structure of FIG. 6D. The metal layer or metal-containing layer 614 is recessed to form recessed conductive layer 616. As a result of the inwardly tapering sidewalls of the dielectric plug material 610, undesirable conductive remnants 617 are formed along the upper sidewall surfaces of the dielectric plug material 610, as is depicted in FIG. 6F.

In accordance with one or more embodiments described herein, treatment of an oxide spacer material is used to reduce an etch rate at the top of the spacer material (e.g., the top of the fin trench) only. After treatment of the spacer material, the SAW profile can be engineered. Approaches described herein can be implemented to address dual metal gate (DMG) and/or trench contact (TCN) metal recess issues as well as polysilicon (dummy gate) remaining issues that may result when any of such materials accumulate on upper wall sidewalls but under a SAW "shadow" created by inwardly tapering SAW structures.

FIGS. 7A-7F illustrate cross-sectional views representing various operations in a process for fabricating self-aligned gate endcap (SAGE) structures with vertical sidewalls, in accordance with an embodiment of the present disclosure.

A process flow can be implemented for generating non-conformal fin spacers. In an exemplary processing scheme, FIGS. 7A-7F illustrate cross-sectional views representing various operations in a process for fabricating self-aligned gate endcap (SAGE) structures with vertical sidewalls, in accordance with an embodiment of the present disclosure.

Figure 7A:
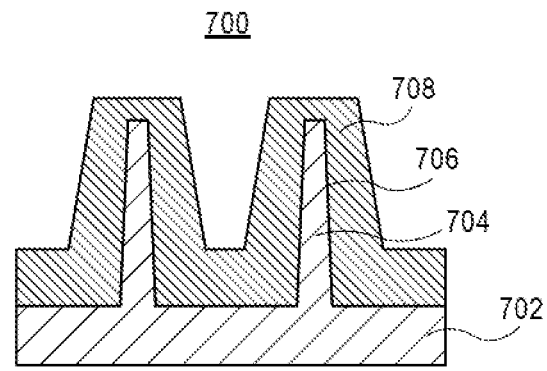
FIGS. 7A-7F illustrate cross-sectional views representing various operations in a process for fabricating self-aligned gate endcap (SAGE) structures with vertical sidewalls, in accordance with an embodiment of the present disclosure.

Referring to FIG. 7A, a starting structure 700 includes fins 704 that are fabricated as protruding from a substrate 702. In an embodiment, the fins 704 and the substrate 702 are composed of single crystalline silicon. Each fin 704 has outwardly tapering (top to bottom) sidewalls 706. A dielectric spacer-forming material 708 is formed conformal with the outwardly tapering sidewalls 706 of the fins 704. In one embodiment, the dielectric spacer-forming material 708 is a silicon oxide (SiOx) material). In one such embodiment, the silicon oxide (SiOx) material is formed using a thermal atomic layer deposition (ALD) process.

Figure 7B:
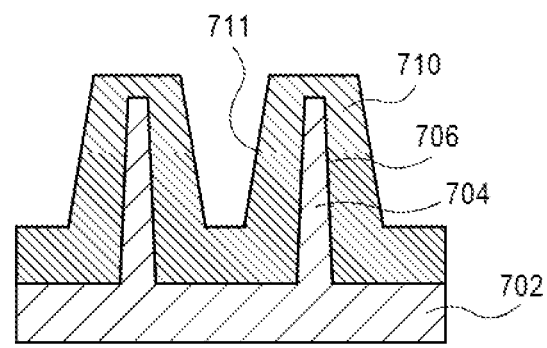

Referring to FIG. 7B, the dielectric spacer-forming material 708 is treated to form a modified dielectric spacer-forming material 710 having a densified upper portion, e.g., at approximately location 711 and upwards. In an embodiment, the treatment reduces an etch rate (ER) of the dielectric spacer-forming material 708 at the top as compared to the bottom of the dielectric spacer-forming material 708. In one embodiment, an $O_2$ plasma is used to selectively densify the top of the SiOx spacer material. Not to be bound by theory, but it is understood that the treatment brings the upper portion closer to stoichiometric $SiO_2$ which has a lower ER. As a result, ER varies gradually along the trench depth due to the treatment, providing for a tunable structure.

Figure 7C:
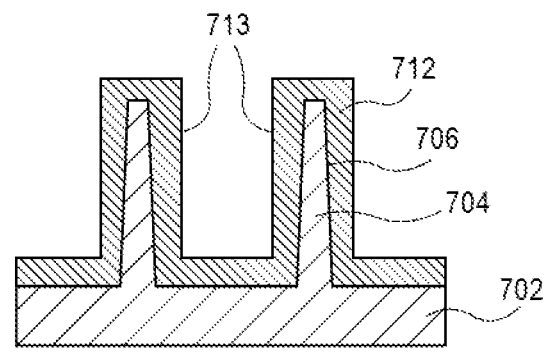

Referring to FIG. 7C, the modified dielectric spacer-forming material 710 is subjected to an etch process to provide a twice modified dielectric spacer-forming material 712. In an embodiment, the densified upper portion 711 of the modified dielectric spacer-forming material 710 enables use of the etch process to form twice modified dielectric spacer-forming material 712 as having vertical or near vertical sidewalls 713. The vertical or near vertical sidewalls 713 of the twice modified dielectric spacer-forming material 712 are in contrast to the conformal outwardly tapering sidewalls of the dielectric spacer-forming material 708 and the modified dielectric spacer-forming material 710 of FIGS. 7A and 7B, respectively.

Figure 7D:
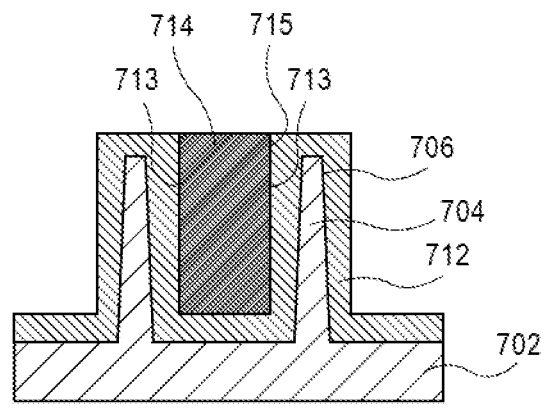

Referring to FIG. 7D, a dielectric plug material 714 (e.g., a SAGE wall or SAW material) is formed and retained on the twice modified dielectric spacer-forming material 712 between the fins 704. In an embodiment, the dielectric plug material 714 has vertical or near vertical sidewalls 715 because the sidewalls are conformal with the vertical or near vertical sidewalls 713 of the twice modified dielectric spacer-forming material 712. Accordingly, although the fins 704 have outwardly tapering sidewalls 706, the dielectric plug material 714 has vertical or near vertical sidewalls.

Figure 7E:
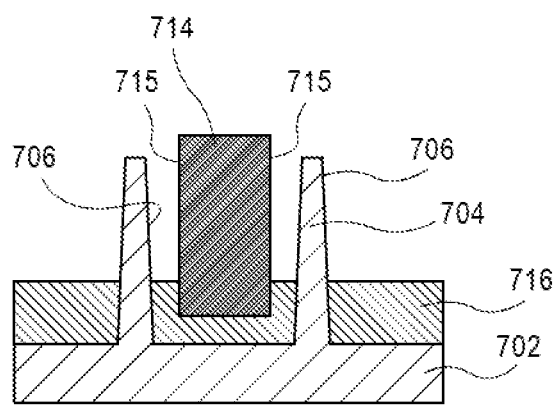
Figure 7F:
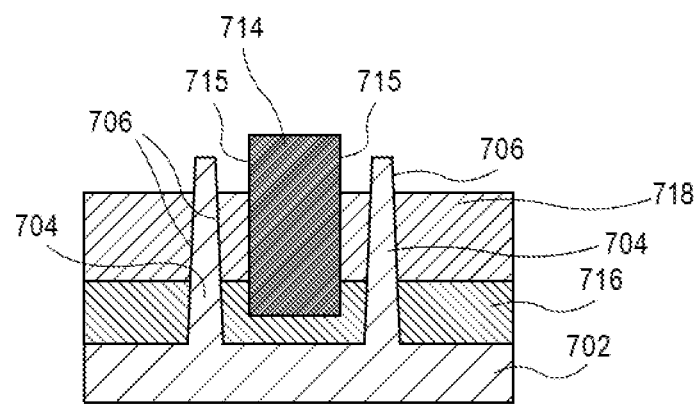

Referring to FIG. 7E, the twice modified dielectric spacer-forming material 712 is recessed to provide a trench isolation structure 716. The dielectric plug material 714 is seated in the trench isolation structure 716.

It is to be appreciated that the structure of FIG. 7E can be used as a starting structure for SAGE architecture fabrication. For example, in one embodiment, subsequent processing may involve the fabrication of gate lines after forming the above described dielectric plug material 714 of FIG. 7E. Such gate lines may be dummy gate lines. The dummy gate lines can later be replaced with permanent gate structures, e.g., using a replacement gate process. Trench contacts can also be formed adjacent to dielectric plug material 714. In an example, referring to FIG. 7F, a metal layer or metal-containing layer is formed over the structure of FIG. 7E and then recessed to form recessed conductive layer 718. In an embodiment, in contrast to FIG. 6F, as a result of the vertical or near vertical sidewalls 715 of the dielectric plug material 714, undesirable conductive remnants are not formed along the upper sidewall surfaces of the dielectric plug material 714.

With reference again to FIG. 7E, in accordance with an embodiment of the present disclosure, an integrated circuit structure includes a semiconductor fin 704 having sidewalls 706 along a length of the semiconductor fin 704, each sidewall 706 tapering outwardly from a top of the semiconductor fin 704 toward a bottom of the semiconductor fin 704. A gate endcap isolation structure 714 is spaced apart from the semiconductor fin 704 and has a length parallel with the length of the semiconductor fin 704. The gate endcap isolation structure 714 has a substantially vertical sidewall 715 laterally facing one of the outwardly tapering sidewalls 706 of the semiconductor fin 704.

In an embodiment, the one of the outwardly tapering sidewalls 706 of the semiconductor fin 704 tapers at an angle greater than 5 degrees from vertical, and the substantially vertical sidewall 715 of the gate endcap isolation structure 714 tapers inwardly (from top to bottom) at an angle in the range of zero degrees to less than 5 degrees from vertical. In another embodiment, the one of the outwardly tapering sidewalls 706 of the semiconductor fin 704 tapers at an angle between 5-10 degrees from vertical, and the substantially vertical sidewall 715 of the gate endcap isolation structure 714 tapers inwardly at an angle in the range of 0-2 degrees from vertical.

In an embodiment, the gate endcap isolation structure 714 has an upper surface above an upper surface of the semiconductor fin 704, as is depicted. In another embodiment, not depicted, the gate endcap isolation structure 714 has an upper surface approximately co-planar with an upper surface of the semiconductor fin 704.

In an embodiment, the gate endcap isolation structure 714 includes a lower dielectric portion and a dielectric cap on the lower dielectric portion, e.g., as is described in greater detail below. In an embodiment, the gate endcap isolation structure includes a vertical seam centered within the gate endcap isolation structure, e.g., as is described in greater detail below. In an embodiment, a gate electrode is over the semiconductor fin 704 and in contact with the gate endcap isolation structure 714, exemplary structures of which are described in greater detail below.

In another aspect, SAGE walls may vary by width, location, and function with respect to differing devices. In an exemplary implementation, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage endcap process is combined with an ultra-scaled finfet transistor architecture to provide a multi-self-aligned endcap process, where at least some of the SAGE structures (if not all) are fabricated without a fin end gap.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitations imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture. The logic transistor endcap is ultra-scaled by using the self-aligned endcap architecture, while the high-voltage transistor has a wider endcap to accommodate a thicker gate dielectric. One or both of the types of endcaps can be fabricated without a fin end gap, in accordance with embodiments described herein.

One or more embodiments described herein are directed to, or may be referred to as, a multi-unidirectional endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness.

Figure 8A:
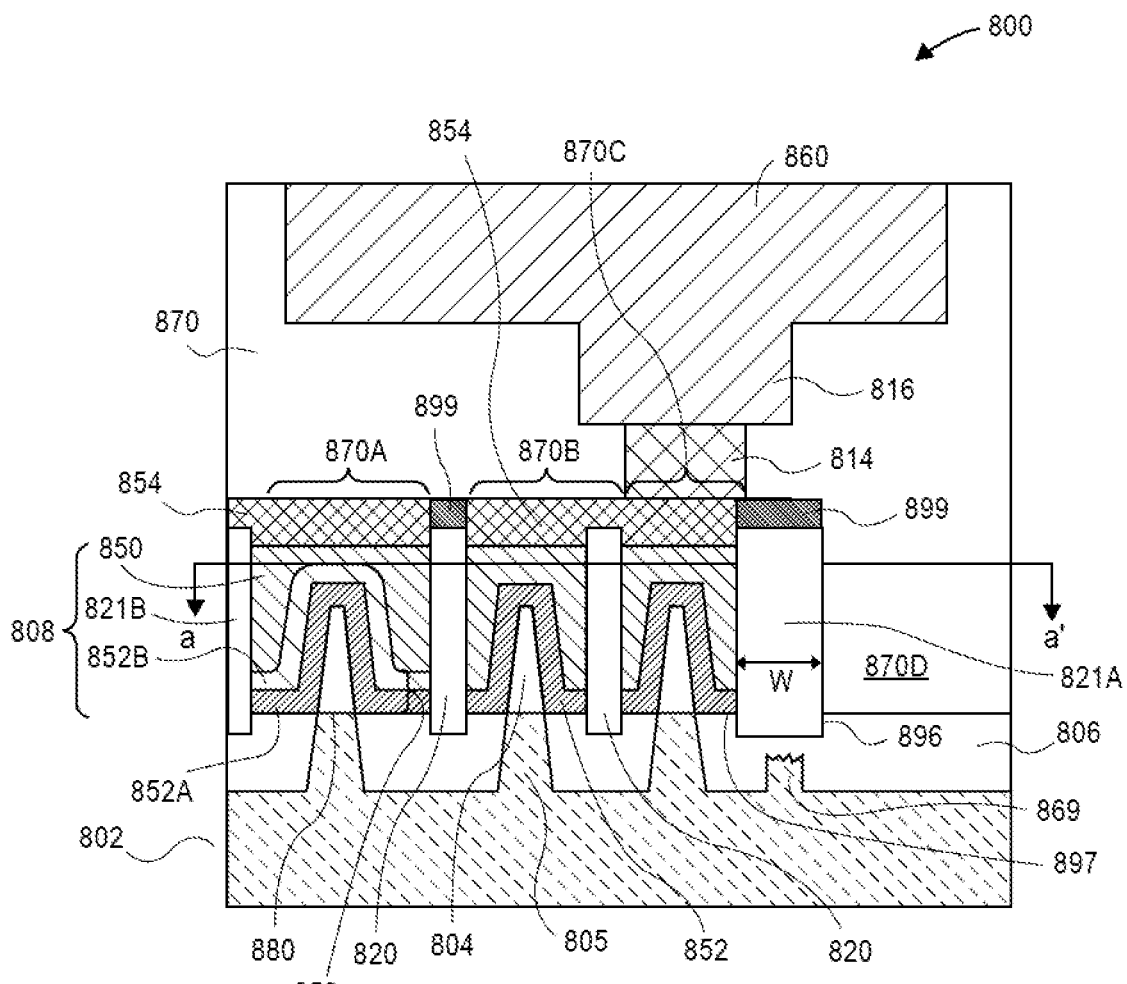
FIG. 8A illustrates a cross-sectional view of non-planar semiconductor devices having a multi-self-aligned gate endcap isolation structure architecture, in accordance with an embodiment of the present disclosure.
Figure 8B:
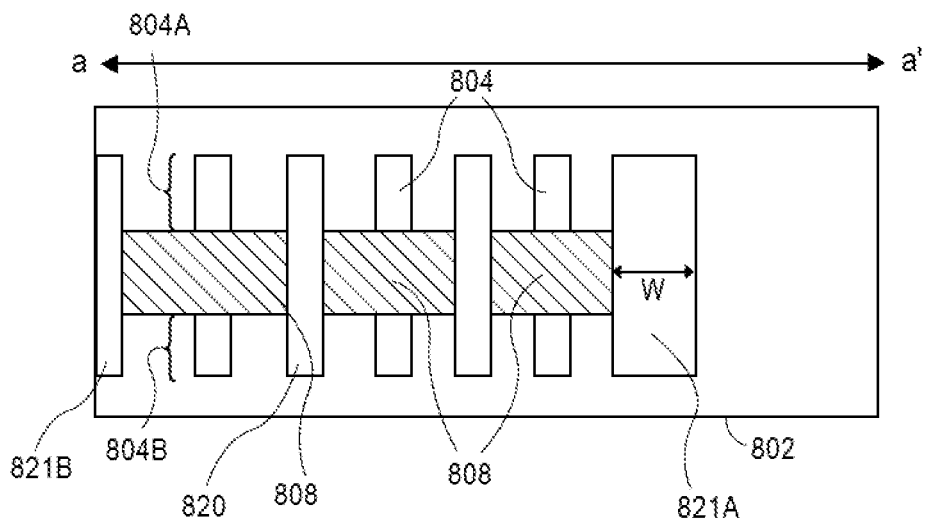
FIG. 8B illustrates a plan view taken along the a-a' axis of the semiconductor devices of FIG. 8A, in accordance with an embodiment of the present disclosure.

As an example of completed devices, FIG. 8A illustrates a cross-sectional view of non-planar semiconductor devices having a multi-self-aligned gate endcap isolation structure architecture, in accordance with an embodiment of the present disclosure. FIG. 8B illustrates a plan view taken along the a-a' axis of the structure of FIG. 8A, in accordance with an embodiment of the present disclosure.

Referring to FIG. 8A, a semiconductor structure 800 includes non-planar active regions (e.g., fin structures each including a protruding fin portion 804 and a sub-fin region 805) formed from substrate 802, and within a trench isolation layer 806. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 804 depicted may represent corresponding individual fins, or may represent a plurality of fins at a given location.

In an embodiment, each of the individual fins 804 has outwardly tapering sidewalls, as is depicted. In one such embodiment, each of the outwardly tapering sidewalls of each of the individual fins 804 tapers at an angle greater than 5 degrees from vertical. In another such embodiment, each of the outwardly tapering sidewalls of each of the individual fins 804 tapers at an angle between 5-10 degrees from vertical.

Gate structures 808 are over the protruding portions 804 of the non-planar active regions as well as over a portion of the trench isolation layer 806. As shown, gate structures 808 include a gate electrode 850 and a gate dielectric layer 852. In one embodiment, although not shown, gate structures 808 may also include a dielectric cap layer.

Gate structures 808 are separated by narrow self-aligned gate endcap (SAGE) isolation structures or walls 820, 821A or 821B. The SAGE walls 820 each have a width. In an embodiment, the SAGE wall 821A has a width greater than the width of each of the SAGE walls 820, and the SAGE wall 821B has a width less than the width of each of the SAGE walls 820. SAGE walls of differing width may be associated with different device types, as described in exemplary embodiments herein. It is to be appreciated that the varying of widths for SAGE walls can be rearranged. Also, in other embodiments, the widths are all the same. Each SAGE wall 820, 821A or 821B may include one or more of a local interconnect 854 or a dielectric plug 899 formed thereon. In an embodiment, each of the SAGE walls 820, 821A or 821B is recessed below an uppermost surface 897 of the trench isolation layer 806, as is depicted in FIG. 8A.

In an embodiment, each of the sidewalls of each of the SAGE isolation structures or walls 820, 821A or 821B is a vertical or near vertical sidewall. In one such embodiment, each of the sidewalls of each of the SAGE isolation structures or walls 820, 821A or 821B tapers inwardly at an angle in the range of zero degrees to less than 5 degrees from vertical. In another such embodiment, each of the sidewalls of each of the SAGE isolation structures or walls 820, 821A or 821B tapers inwardly at an angle in the range of 0-2 degrees from vertical.

In accordance with an embodiment of the present disclosure, SAGE wall 821A is formed in a location of a cut fin. In a particular embodiment, SAGE wall 821A is formed over a cut portion 869 of a fin, as is depicted. In an embodiment, SAGE walls 820, 821A and 821B are fabricated subsequent to a fin cut process.

In an exemplary embodiment, the semiconductor structure 800 includes a first plurality of semiconductor fins (fin or fins 804 of region 870A) above a substrate 802 and protruding through an uppermost surface 897 of a trench isolation layer 806, and a first gate structure (gate structure 808 of region 870A) over the first plurality of semiconductor fins. A second plurality of semiconductor fins (fin or fins 804 of region 870B) is above the substrate 802 and protrudes through the uppermost surface 897 of the trench isolation layer 806, and a second gate structure (gate structure 808 of region 870B) is over the second plurality of semiconductor fins. A gate endcap isolation structure (left-hand SAGE wall 820) is between and in contact with the first gate structure and the second gate structure. A semiconductor fin of the first plurality of semiconductor fins closest to the gate endcap isolation structure (from region 870A) is spaced farther from the gate endcap isolation structure than a semiconductor fin of the second plurality of semiconductor fins closest to the gate endcap isolation structure (from region 870B).

In an embodiment, region 870A is an I/O region, and region 870B is a logic region. As depicted, in one such embodiment, a second logic region 870C is adjacent the logic region 870B, and is electrically connected to the logic region 870B by a local interconnect 854. Another region 870D may be a location where an addition logic or I/O region may be placed. Embodiments described herein may involve differential spacing from a SAGE wall (e.g., a wider spacing from SAGE walls 821B and left-hand 820 in region 870A), or may involve SAGE walls of differing width (e.g., narrower 821B versus 820 versus wider 821A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

A gate contact 814, and overlying gate contact via 816 are also seen from this perspective, along with an overlying metal interconnect 860, all of which are in inter-layer dielectric stacks or layers 870. Also seen from the perspective of FIG. 8A, the gate contact 814 is, in one embodiment, over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as over the protruding fin portions 804, as isolated by self-aligned gate endcap isolation structures 820. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of trench isolation layer 806, i.e., into the sub-fin region 805.

In an embodiment, the semiconductor structure 800 includes non-planar devices such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a group III-V material and the charge-carrier dopant impurity atoms are ones such as, but not limited to, carbon, silicon, germanium, oxygen, sulfur, selenium or tellurium.

Trench isolation layer 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 806 is composed of a dielectric material such as, but not limited to, silicon dioxide, silicon oxy-nitride, silicon nitride, or carbon-doped silicon nitride.

Self-aligned gate endcap isolation structures 820, 821A and 821B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. Additional examples are described below in association with FIGS. 8A-8B.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer includes a high-k material.

In an exemplary embodiment, the gate structure 808 of region 870A includes a first gate dielectric 852 conformal with the first plurality of semiconductor fins and laterally adjacent to and in contact with a first side of the gate endcap isolation structure (left-hand 820). The second gate stack of region 870B includes a second gate dielectric 852 conformal with the second plurality of semiconductor fins and laterally adjacent to and in contact with a second side of the gate endcap isolation structure opposite the first side of the gate endcap isolation structure. In one embodiment, the first gate dielectric is thicker than the second gate dielectric, as is depicted in FIG. 8A. In one embodiment, the first gate dielectric has more dielectric layers (e.g., layers 852A and 852B) than the second gate dielectric (e.g., only layer 852). In an embodiment, the gate dielectric of region 870A is an I/O gate dielectric, and the gate dielectric of region 870B is a logic gate dielectric.

In an embodiment, the gate dielectric of region 870B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 870A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 852A) is formed below a layer of high-k material (e.g., layer 852B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, overlying gate contact via 816, and overlying metal interconnect 860 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 8A and 8B, SAGE walls of varying width may be fabricated. It is also to be appreciated that fabrication of gate endcap isolation structures may lead to formation of a seam within the gate endcap isolation structures, e.g., as an artifact of a wall material deposition process. It is also to be appreciated that a stack of dielectric layers may be used to form a SAGE wall, e.g., upper and lower wall layers. It is also to be appreciated that gate endcap isolation structures may differ in composition depending on the spacing of adjacent fins.

In an embodiment where a gate endcap isolation structure includes a lower dielectric portion and a dielectric cap on the lower dielectric portion, the gate endcap isolation structure may be formed by first depositing and then recessing a first dielectric material, such as a SiN layer, a SiCN layer, a SiOCN layer, a SiOC layer, or a SiC layer, to provide the lower dielectric portion. In one embodiment, the first dielectric material is a silicon nitride layer. A dielectric cap material, such as a metal oxide material (e.g., hafnium oxide, hafnium aluminum oxide, or aluminum oxide) is then formed in recessed regions above the lower dielectric portion. In one embodiment, the metal oxide material is hafnium oxide. In another embodiment, the dielectric cap material is a low-k dielectric material. The dielectric cap material may be planarized to form the dielectric cap or may be grown upward to provide the dielectric cap directly.

One or more embodiments described above are directed to forming vertical or near vertical sidewalls for a SAGE wall for FinFET devices. It is to be appreciated that other embodiments may include the application of such approaches for fins composed of alternating layers of two dissimilar semiconductor materials (e.g., Si and SiGe or SiGe and Ge). One of the pairs of dissimilar semiconductor materials can then be removed in the gate region to provide nanowire/nanoribbon channels for gate all-around devices. In an embodiment, an approach for gate all-around devices is similar to the approaches described above for FinFETs, with the addition of a nanowire/ribbon release operation in the gate region.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Mo, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
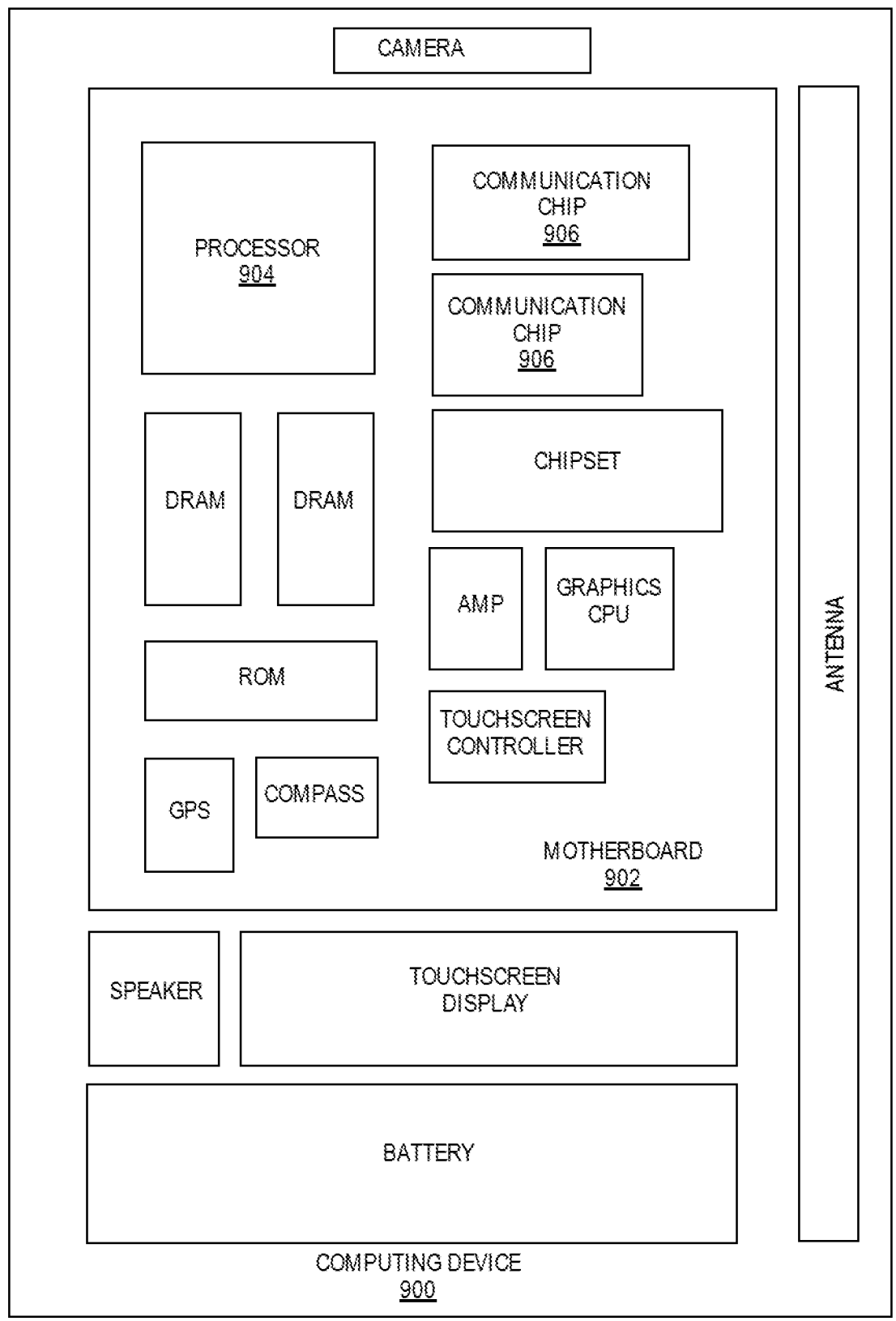
FIG. 9 illustrates a computing device in accordance with one implementation of an embodiment of the disclosure.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as self-aligned gate endcap (SAGE) structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as self-aligned gate endcap (SAGE) structures built in accordance with implementations of embodiments of the present disclosure.

In further implementations, another component housed within the computing device 900 may contain an integrated circuit die that includes one or structures, such as self-aligned gate endcap (SAGE) structures built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
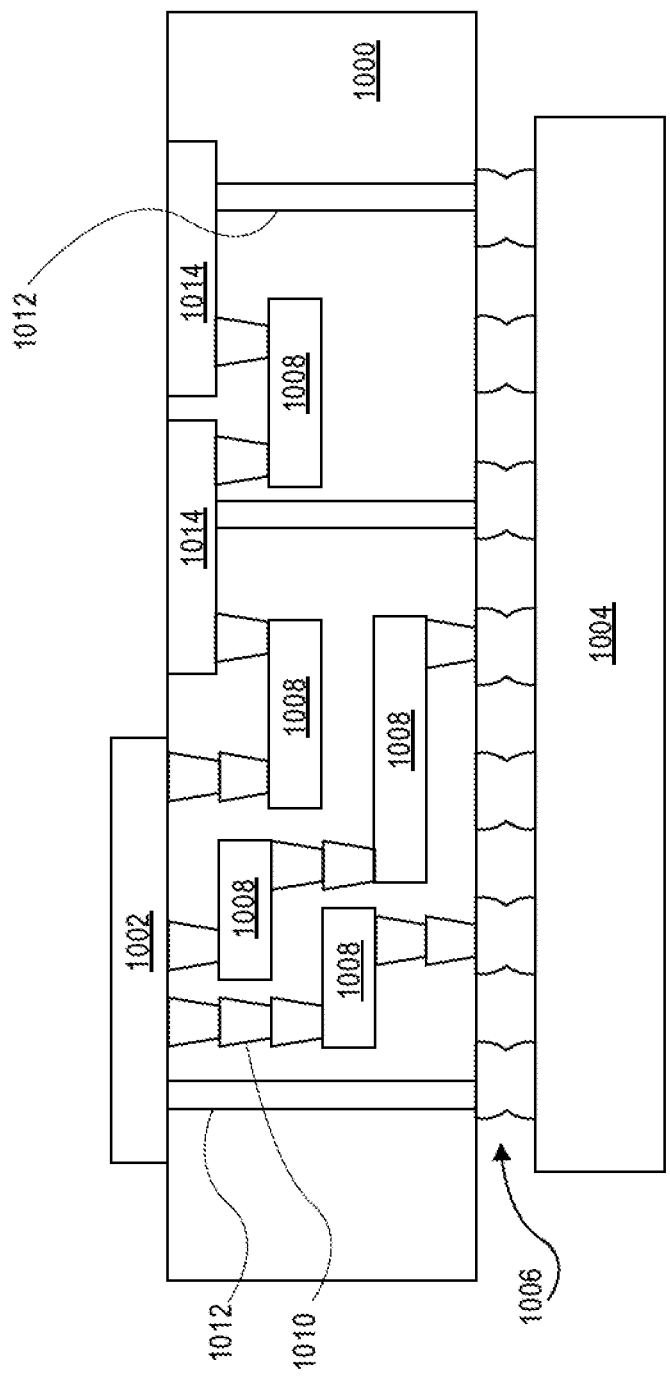
FIG. 10 illustrates an interposer that includes one or more embodiments of the disclosure.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Thus, embodiments of the present disclosure include self-aligned gate endcap (SAGE) architectures with vertical sidewalls, and methods of fabricating self-aligned gate endcap (SAGE) architectures with vertical sidewalls.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor fin having sidewalls along a length of the semiconductor fin, each sidewall tapering outwardly from a top of the semiconductor fin toward a bottom of the semiconductor fin. A gate endcap isolation structure is spaced apart from the semiconductor fin and has a length parallel with the length of the semiconductor fin. The gate endcap isolation structure has a substantially vertical sidewall laterally facing one of the outwardly tapering sidewalls of the semiconductor fin.

Example embodiment 2: The integrated circuit structure of example embodiment 1, wherein the one of the outwardly tapering sidewalls of the semiconductor fin tapers at an angle greater than 5 degrees from vertical, and the substantially vertical sidewall of the gate endcap isolation structure tapers inwardly at an angle in the range of zero degrees to less than 5 degrees from vertical.

Example embodiment 3: The integrated circuit structure of example embodiment 1 or 2, wherein the gate endcap isolation structure has an upper surface above an upper surface of the semiconductor fin.

Example embodiment 4: The integrated circuit structure of example embodiment 1 or 2, wherein the gate endcap isolation structure has an upper surface approximately co-planar with an upper surface of the semiconductor fin.

Example embodiment 5: The integrated circuit structure of example embodiment 1, 2, 3 or 4, wherein the gate endcap isolation structure includes a lower dielectric portion and a dielectric cap on the lower dielectric portion.

Example embodiment 6: The integrated circuit structure of example embodiment 1, 2, 3, 4 or 5, wherein the gate endcap isolation structure includes a vertical seam centered within the gate endcap isolation structure.

Example embodiment 7: The integrated circuit structure of example embodiment 1, 2, 3, 4, 5 or 6, further including a gate electrode over the semiconductor fin and in contact with the gate endcap isolation structure.

Example embodiment 8: An integrated circuit structure includes a first semiconductor fin having sidewalls along a length of the first semiconductor fin, each sidewall tapering outwardly from a top of the first semiconductor fin toward a bottom of the first semiconductor fin. The integrated circuit structure also includes a second semiconductor fin having sidewalls along a length of the second semiconductor fin, each sidewall tapering outwardly from a top of the second semiconductor fin toward a bottom of the second semiconductor fin. The integrated circuit structure also includes a gate endcap isolation structure between and spaced apart from the first semiconductor fin and the second semiconductor fin, the gate endcap isolation structure having a length parallel with the lengths of the first and second semiconductor fins, the gate endcap isolation structure having a first substantially vertical sidewall laterally facing one of the outwardly tapering sidewalls of the first semiconductor fin, and a second substantially vertical sidewall laterally facing one of the outwardly tapering sidewalls of the second semiconductor fin.

Example embodiment 9: The integrated circuit structure of example embodiment 8, wherein the gate endcap isolation structure has an upper surface above an upper surface of the first semiconductor fin and above an upper surface of the second semiconductor fin.

Example embodiment 10: The integrated circuit structure of example embodiment 8, wherein the gate endcap isolation structure has an upper surface approximately co-planar with an upper surface of the first semiconductor fin and approximately co-planar with an upper surface of the second semiconductor fin.

Example embodiment 11: The integrated circuit structure of example embodiment 8, 9 or 10, wherein the one of the outwardly tapering sidewalls of the first semiconductor fin tapers at an angle greater than 5 degrees from vertical, the first substantially vertical sidewall of the gate endcap isolation structure tapers inwardly at an angle in the range of zero degrees to less than 5 degrees from vertical, the one of the outwardly tapering sidewalls of the second semiconductor fin tapers at an angle greater than 5 degrees from vertical, and the second substantially vertical sidewall of the gate endcap isolation structure tapers inwardly at an angle in the range of zero degrees to less than 5 degrees from vertical.

Example embodiment 12: A computing device includes a board and a component coupled to the board. The component includes an integrated circuit structure. The integrated circuit structure includes a semiconductor fin having sidewalls along a length of the semiconductor fin, each sidewall tapering outwardly from a top of the semiconductor fin toward a bottom of the semiconductor fin. A gate endcap isolation structure is spaced apart from the semiconductor fin and has a length parallel with the length of the semiconductor fin. The gate endcap isolation structure has a substantially vertical sidewall laterally facing one of the outwardly tapering sidewalls of the semiconductor fin.

Example embodiment 13: The computing device of example embodiment 12, further including a memory coupled to the board.

Example embodiment 14: The computing device of example embodiment 12 or 13, further including a communication chip coupled to the board.

Example embodiment 15: The computing device of example embodiment 12, 13 or 14, further including a camera coupled to the board.

Example embodiment 16: The computing device of example embodiment 12, 13, 14 or 15, further including a battery coupled to the board.

Example embodiment 17: The computing device of example embodiment 12, 13, 14, 15 or 16, further including an antenna coupled to the board.

Example embodiment 18: The computing device of example embodiment 12, 13, 14, 15, 16 or 17, wherein the component is a packaged integrated circuit die.

Example embodiment 19: The computing device of example embodiment 12, 13, 14, 15, 16, 17 or 18, wherein the component is selected from the group consisting of a processor, a communications chip, and a digital signal processor.

Example embodiment 20: The computing device of example embodiment 12, 13, 14, 15, 16, 17, 18 or 19, wherein the computing device is selected from the group consisting of a mobile phone, a laptop, a desk top computer, a server, and a set-top box.

What is claimed is:
1. An electronic device comprising:
a substrate;
a first fin extending from the substrate;
a second fin extending from the substrate, the first fin and the second fin define a trench therebetween, the first fin having first tapered walls, the second fin having second tapered walls, the first fin having a greater degree of tapering along a first portion of the first fin than along a second portion of the first fin, the first portion of the first fin associated with a base of the first fin, the second portion of the first fin associated with a distal end of the first fin, the second fin having a greater degree of tapering along a first portion of the second fin than along a second portion of the second fin, the first portion of the second fin associated with a base of the second fin, the second portion of the second fin associated with a distal end of the first fin;
a trench isolation structure in the trench, the trench isolation structure separating the first portion of the first fin and the first portion of the second fin, the trench isolation structure adjacent the substrate;
a gate structure including a first portion and a second portion extending along a first side and a second side, respectively, of the second portion of the first fin, the gate structure including a third portion extending over the distal end of the first fin, the third portion of the gate structure connecting the first portion of the gate structure and the second portion of the gate structure, the third portion of the gate structure including a gate material extending continuously between a first point on the gate structure and a second point on the gate structure, the first point being a point of the gate material closest to the distal end of the first fin along a first line collinear with a central axis of the first fin, the second point being a point of the gate material farthest from the distal end of the first fin along the first line, the gate structure including a fourth portion and a fifth portion extending along a first side and a second side, respectively, of the second portion of the second fin, the gate structure including a sixth portion extending over the distal end of the second fin, the sixth portion of the gate structure connecting the fourth portion of the gate structure and the fifth portion of the gate structure, the gate material extending continuously between a third point on the gate structure and a fourth point on the gate structure, the third point being a point of the gate material closest to the distal end of the second fin along a second line collinear with a central axis of the second fin, the fourth point being a point of the gate material farthest from the distal end of the second fin along the second line, the gate material including at least one of aluminum or titanium; and
a wall between the first fin and the second fin, the trench isolation structure extending around an end of the wall, the wall including carbon, silicon, and nitrogen, the end of the wall spaced apart from the substrate with the trench isolation structure therebetween, a first side of the wall facing at least a portion of the first fin with the second portion of the gate structure therebetween, a second side of the wall facing at least a portion of the second fin with the fourth portion of the gate structure therebetween.

2. The electronic device as defined in claim 1, wherein the gate structure is a first gate structure, and the wall is a first wall, the electronic device further including:
a second gate structure; and
a second wall, the first gate structure electrically isolated from the second gate structure by the second wall extending therebetween.

3. The electronic device as defined in claim 2, wherein the first wall has a first width, and the second wall has a second width that is greater than the first width.

4. The electronic device as defined in claim 1, wherein the end of the wall is a first end, the wall includes a second end opposite the first end, and the electronic device includes an interconnect material extending over the second end of the wall, the third portion of the gate structure and the sixth portion of the gate structure electrically coupled along the interconnect material.

5. The electronic device as defined in claim 4, wherein the interconnect material includes tungsten.

6. The electronic device as defined in claim 1, wherein the distal end of the first fin is aligned with the distal end of the second fin.

7. The electronic device as defined in claim 1, wherein the wall extends parallel to an elongate length of the first fin.

8. The electronic device as defined in claim 1, wherein the first fin is associated with an N-type transistor, and the second fin is associated with a P-type transistor.

9. The electronic device as defined in claim 1, wherein the electronic device is a computing device.

10. The electronic device as defined in claim 1, further including a display.

11. A computing device comprising:
a substrate;
a first fin extending from the substrate;
a second fin extending from the substrate, the first fin and the second fin defining a trench therebetween;
a trench isolation material at a base of the trench, the first fin extending farther away from the substrate than the trench isolation material extends away from the substrate, the second fin extending farther away from the substrate than the trench isolation material extends away from the substrate, the trench isolation material including silicon and oxygen;
an isolation wall between the first fin and the second fin, the isolation wall including carbon, silicon, and nitrogen, the isolation wall extending into the trench isolation material; and
a gate structure including at least one of aluminum, titanium, hafnium, oxygen, or nitrogen, the first fin extending into a first opening in a first portion of the gate structure, the first portion of the gate structure having a first surface adjacent to and surrounding a top surface and opposing sidewalls of the first fin, the first portion of the gate structure having a second surface distal to and facing away from the top surface of the first fin, the second surface in contact with a gate interconnect, the first portion of the gate structure contiguous between a first point on the first surface and a second point on the second surface, the first point and the second point in a first plane aligned with the first fin and centered between the opposing sidewalls of the first fin, the second fin extending into a second opening in a second portion of the gate structure, the second portion of the gate structure having a third surface adjacent to and surrounding a top surface and opposing sidewalls of the second fin, the second portion of the gate structure having a fourth surface distal to and facing away from the top surface of the second fin, the fourth surface in contact with the gate interconnect, the second portion of the gate structure contiguous between a third point on the third surface and a fourth point on the fourth surface, the third point and the fourth point in a second plane aligned with the second fin and centered between the opposing sidewalls of the second fin, the isolation wall extending between the first portion of the gate structure and the second portion of the gate structure, a first part of the first portion of the gate structure between the first fin and the isolation wall, a second part of the second portion of the gate structure between the second fin and the isolation wall, the first portion of the gate structure electrically coupled to the second portion of the gate structure over an end of the isolation wall, the end of the isolation wall distal to the substrate, a portion of the isolation wall closer to the substrate than the gate structure is to the substrate.

12. The computing device as defined in claim 11, wherein the isolation wall is a first isolation wall, and further including a second isolation wall, the second fin between the first isolation wall and the second isolation wall.

13. The computing device as defined in claim 12, wherein the gate structure is a first gate structure, and further including a second gate structure, the second isolation wall separating the first gate structure from the second gate structure.

14. The computing device as defined in claim 12, wherein the first isolation wall has a first width, and the second isolation wall has a second width that is greater than the first width.

15. The computing device as defined in claim 11, wherein the isolation wall includes a first side and a second side opposite the first side, the first side of the isolation wall faces at least a first portion of the first fin, and the second side of the isolation wall faces at least a second portion of the second fin.

16. The computing device as defined in claim 11, further including the gate interconnect electrically coupled to the gate structure, the gate interconnect including tungsten.

17. The computing device as defined in claim 11, wherein a distal end of the first fin is aligned with a distal end of the second fin.

18. The computing device as defined in claim 11, wherein the isolation wall extends parallel to an elongate length of the first fin.

19. The computing device as defined in claim 11, further including a display.

20. The computing device as defined in claim 11, wherein the first fin is associated with an N-type transistor, and the second fin is associated with a P-type transistor.

21. An apparatus comprising:
a plurality of fins on a semiconductor substrate, the plurality of fins having opposing sidewalls that are tapered, an angle of tapering of the sidewalls greater adjacent bases of the plurality of fins than adjacent top surfaces of the plurality of fins;
a plurality of isolation walls at least partially interleaved with at least some of the plurality of fins, the plurality of isolation walls separated from the substrate by a trench isolation material, the trench isolation material between adjacent ones of the plurality of fins, the plurality of isolation walls including carbon, silicon, and nitrogen; and
a conductive material extending around the top surfaces and the opposing sidewalls of the plurality of fins, the plurality of isolation walls closer to the substrate than the conductive material is to the substrate, different portions of the conductive material corresponding to different gate electrodes of different transistors, the conductive material extending along unobstructed paths between first surfaces of the gate electrodes adjacent the top surfaces of the plurality of fins and second surfaces of the gate electrodes adjacent interconnects on sides of the gate electrodes opposite the plurality of fins, the conductive material including at least one of aluminum or titanium, at least some of the plurality of isolation walls separating adjacent ones of the different gate electrodes, the conductive material of the different gate electrodes extending between adjacent ones of the plurality of isolation walls and corresponding ones of the plurality of fins, at least some of the different portions of the conductive material extending around different ones of the plurality of fins electrically coupled to other ones of the different portions of the conductive material extending around other ones of the plurality of fins along ones of the interconnects that extend over intervening ones of the plurality of isolation walls.

22. The apparatus as defined in claim 21, wherein at least some of the different portions of the conductive material extending around different ones of the plurality of fins are electrically isolated from other ones of the different portions of the conductive material extending around other ones of the plurality of fins by intervening ones of the plurality of isolation walls positioned therebetween.

23. The apparatus as defined in claim 21, wherein different ones of the plurality of isolation walls have different widths.

24. The apparatus as defined in claim 21, wherein the interconnects include tungsten.

25. The apparatus as defined in claim 21, wherein the top surfaces of the plurality of fins are aligned.

26. The apparatus as defined in claim 21, wherein the plurality of isolation walls extend parallel to the plurality of fins.

27. The apparatus as defined in claim 21, further including a display.

28. The apparatus as defined in claim 21, wherein at least some of the different transistors are N-type transistors, and at least some of the different transistors are P-type transistors.

* * * * *